United States Patent [19]

Shibaike et al.

[11] Patent Number: 5,350,499
[45] Date of Patent: Sep. 27, 1994

[54] METHOD OF PRODUCING MICROSCOPIC STRUCTURE

[75] Inventors: Narito Shibaike, Hirakata; Michiyoshi Nagashima, Ikoma; Fumiaki Ueno, Hirakata; Toshinori Kishi, Osaka, all of Japan

[73] Assignee: Matsushita Electric Industrial Co., Ltd., Osaka, Japan

[21] Appl. No.: 34,619

[22] Filed: Mar. 19, 1993

Related U.S. Application Data

[63] Continuation of Ser. No. 757,533, Sep. 11, 1991, abandoned.

[30] Foreign Application Priority Data

Sep. 17, 1990 [JP] Japan .................................. 2-247713

[51] Int. Cl.⁵ ................................................ B44C 1/00
[52] U.S. Cl. .................. 204/192.34; 156/651; 156/661.1; 156/643
[58] Field of Search .................. 156/643, 661.1, 651; 204/298.36, 192.34

[56] References Cited

U.S. PATENT DOCUMENTS

| | | | |
|---|---|---|---|
| 4,869,780 | 9/1989 | Yang et al. | 204/192.34 X |
| 4,935,334 | 6/1990 | Boettiger et al. | 430/397 X |
| 4,988,404 | 1/1991 | Aoyagi | 156/651 |
| 5,032,243 | 7/1991 | Bache et al. | 204/192.34 |
| 5,035,770 | 7/1991 | Braun | 156/643 |

FOREIGN PATENT DOCUMENTS

| | | |
|---|---|---|
| 0253066 | 1/1988 | European Pat. Off. . |
| 2253253 | 6/1975 | France . |
| 55-39646 | 3/1980 | Japan .................. 204/192.34 |
| 8900714 | 1/1989 | PCT Int'l Appl. . |

OTHER PUBLICATIONS

Patent Abstracts of Japan, vol. 6, No. 16 (E-92) Jan. 29, 1982.
Patent Abstracts of Japan, vol. 14, No. 139 (E-903) Mar. 15, 1990.

*Primary Examiner*—Thi Dang
*Attorney, Agent, or Firm*—Wenderoth, Lind & Ponack

[57] ABSTRACT

A method of producing a microscopic structure by anisotropic etching, in which ion etcing is conducted by irradiating an ion beam emitted by an ion source over a workpiece while a direction of progress of the ion etching is being changed.

2 Claims, 9 Drawing Sheets

METHOD OF PRODUCING MICROSCOPIC STRUCTURE

This application is a continuation of now abandoned application, Ser. No. 07/757,533, filed Sep. 11, 1991, now abandoned.

BACKGROUND OF THE INVENTION

The present invention relates to a microscopic structure having a size of about several microns to several hundred microns.

For producing the microscopic structure, a LIGA (Lithographie, Galvanoformung, Abformung) process which is being developed in Germany is known. FIGS. 1(a) to 1(d) show steps of the LIGA process in which reference numeral 1 denotes a metallic substrate, reference numeral 2 denotes a PMMA (polymethyl methacrylate) resist film coated thickly on the metallic substrate 1, reference numeral 3 denotes a masking substrate, reference numeral 4 denotes a masking pattern, reference numeral 5 denotes synchrotron radiation and reference numeral 6 denotes electroformed nickel. The synchrotron radiation 5 is emitted by a synchrotron (not shown) and is a powerful X-ray whose beam has a narrow spread. In the known LIGA process, a microscopic metallic member is produced in the following steps (a) to (d) corresponding to FIGS. (a) to 1(d), respectively.

(a) The PMMA resist film 2 is deeply exposed through the masking pattern 4 by the synchrotron radiation 5 as shown by the broken lines in FIG. 1(a).

(b) The exposed portions of the PMMA resist film 2 are removed by development such that cavities are formed in the PMMA resist film 2 as shown in FIG. 1(b).

(c) Nickel 6 is filled in the cavities of the PMMA resist film 2 by electroforming as shown in FIG. 1(c).

(d) The PMMA resist film 2 is removed and thus, the electroformed nickel 6 remains on the metallic substrate 1 as shown in FIG. 1(d).

In the above known method, it is possible to obtain a microscopic metallic structure having a high aspect ratio but its cross-sectional shape is restricted to a rectangular shape formed by parallel lines defined by the synchrotron radiation. Therefore, the known method has such a drawback that since three-dimensional shape of the structure is limited, a structure having an arbitrary three-dimensional shape cannot be obtained, thus resulting in lack of versatility in use.

SUMMARY OF THE INVENTION

Accordingly, an essential object of the present invention is, with a view to eliminating the conventional inconveniences, to provide a method of producing a microscopic structure, by which a three-dimensional shape of a microscopic structure having a high degree of freedom can be obtained, and thus, the shape is not restricted to a rectangular shape but rather can have such shapes as gradients, combination of straight lines and curves, etc.

In order to accomplish this object of the present invention, there is provided a method of producing a microscopic structure, according to a first embodiment of the present invention in which anisotropic etching is performed while a direction of progress of the etching is being changed.

Alternatively, in a method of producing a microscopic structure, according to a second embodiment of the present invention, a photoresist is exposed while a direction for exposing the photoresist is being changed.

By the method according to the first embodiment of the present invention, a three-dimensional structure having quite a high degree of freedom of shape can be obtained so as to have such cross-sectional shapes as gradients, combination of straight lines and curves, etc.

Meanwhile, by the method according to the second embodiment of the present invention, a three-dimensional structure having a cross-sectional shape of gradients can be obtained.

BRIEF DESCRIPTION OF THE DRAWINGS

This object of the present invention will become apparent from the following description taken in conjunction with the preferred embodiments thereof with reference to the accompanying drawings, in which.

Before the description of the present invention proceeds, it is to be noted that like parts are designated by like reference numerals throughout several views of the accompanying drawings.

DETAILED DESCRIPTION OF THE INVENTION

Figure 1:
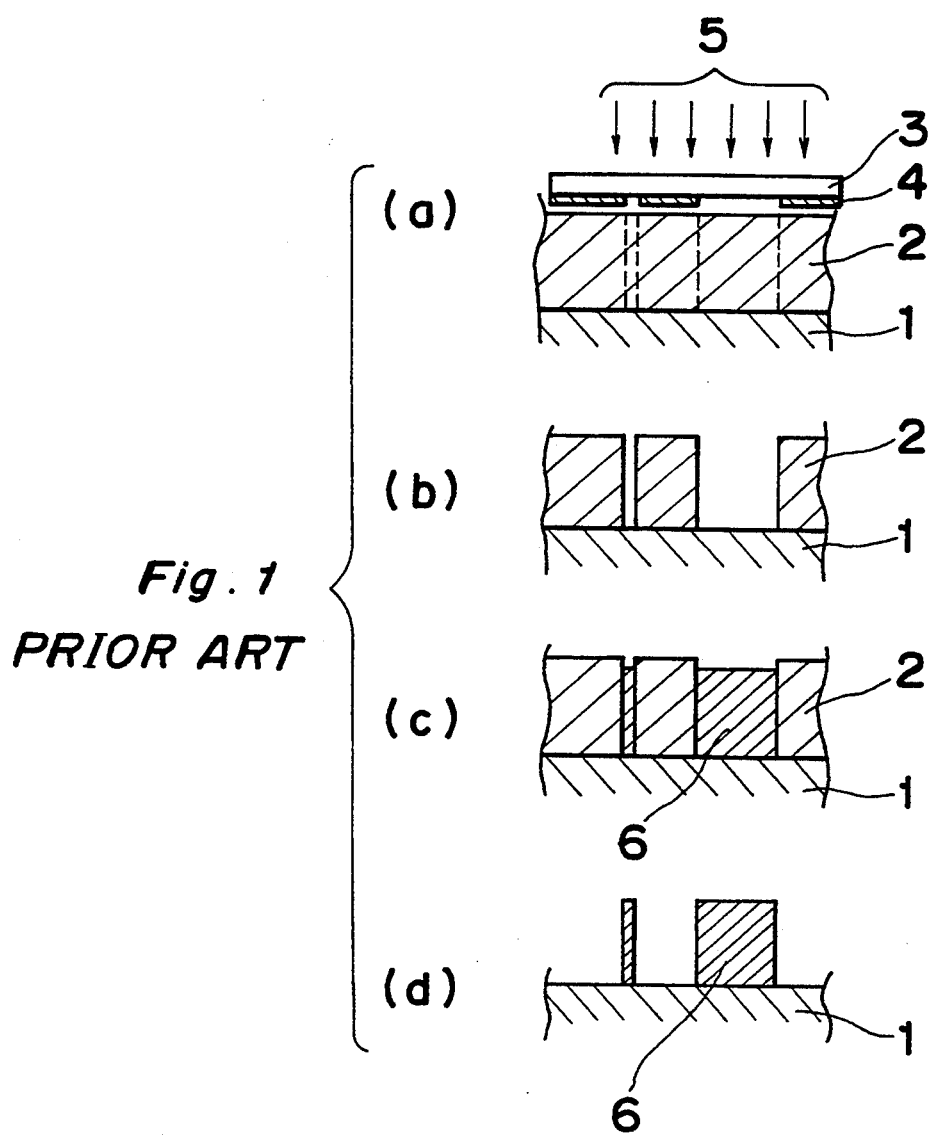
FIGS. 1(a) to 1(d) are views showing steps of a prior art method of producing a microscopic structure (already referred to)
Figure 2:
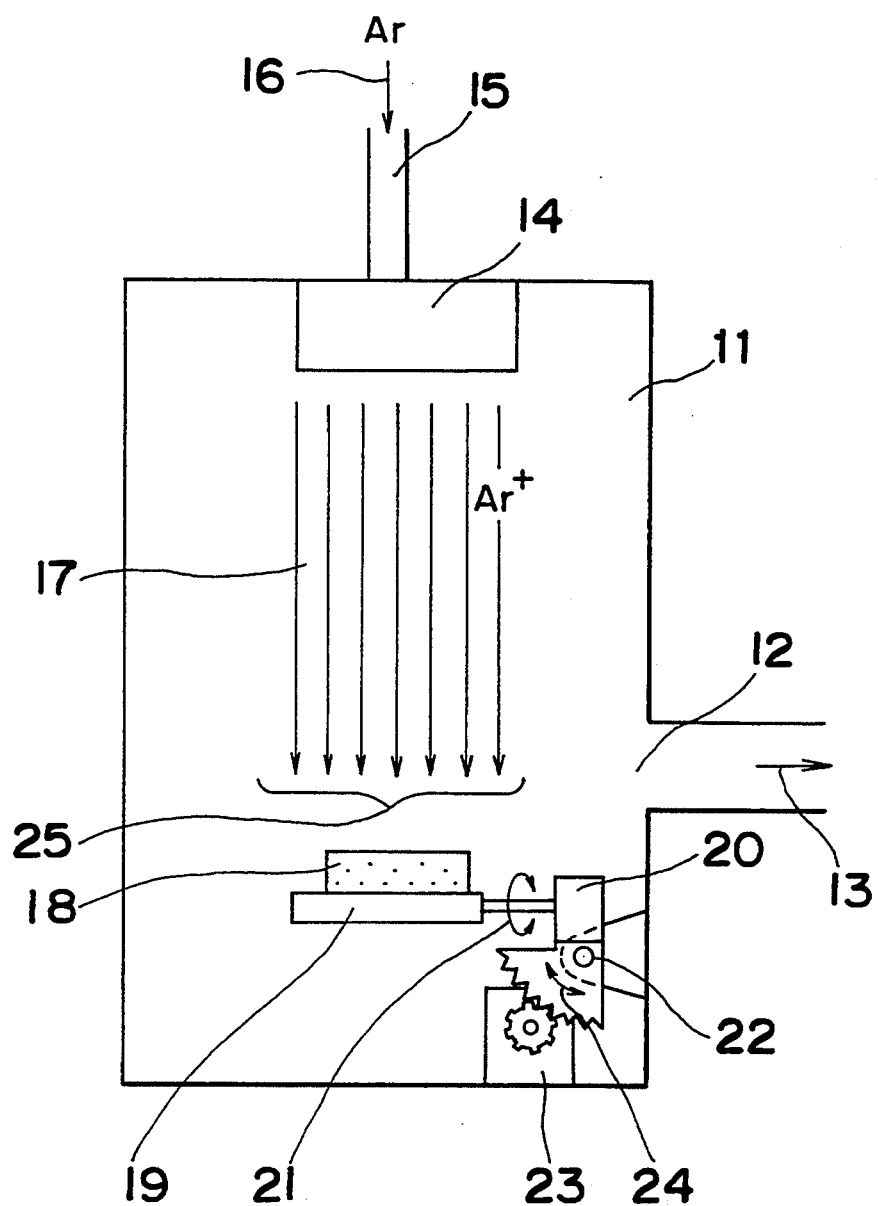
FIG. 2 is a schematic view of an ion etching machine used for carrying out a method of producing a microscopic structure, according to a first embodiment of the present invention.

Referring now to the drawings, there is shown in FIG. 2, an ion etching machine used for carrying out a method of producing a microscopic structure, according to a first embodiment of the present invention. In FIG. 2, air is exhausted from a vacuum chamber 11 in the direction of the arrow 13 through an opening 12 by a pump (not shown)o Argon gas is fed into a Kaufmann type ion source 14 in the direction of the arrow 16 through a pipe 15. In the ion source 14, argon gas is electrically discharged between a filament cathode and a cylindrical anode and generated $Ar^+$ ion is passed through a grid so as to be outwardly drawn in the direction of the arrow 17 as an accelerated parallel ion beam 25.

A workpiece 18 is secured to a support 19 which can be rotated in the direction of the arrow 21 by a motor 20. The motor 20 itself is rotatably supported by a shaft 22 so as to be rotated about the shaft 22 in the direction of the arrow 24 by a motor 23.

By the above described arrangement of the ion etching machine, the workpiece 18 can be etched by setting an angle of the workpiece 18 relative to the ion beam 25 to an arbitrary value in two degrees of freedom. Meanwhile, it is also possible to emit the ion beam 25 while the motors 22 and 23 are being driven, namely, while posture of the workpiece 18 is being changed.

Hereinbelow, five examples of steps of the method of producing the microscopic structure by using the ion etching machine of FIG. 2, according to the first embodiment of the present invention are described with reference to FIGS. 3 to 7, respectively.

In the first example, FIGS. 3(a) to 3(c) show the following steps (a) to (c) of the method according to the first embodiment of the present invention, respectively.

(a) A substrate 31 is secured to the support 19 of FIG. 2. The workpiece 18 is formed on the substrate 31 by sputtering, deposition, etc. and a resist 32 is formed on the workpiece 18 as shown in FIG. 3(a). By controlling the motor 20 or 23 of FIG. 2, a relative angle between the workpiece 18 and the ion beam 25, namely, an angle of incidence of the ion beam 25 relative to the workpiece 18 is set obliquely as shown in FIG. 3(a). As a result, the workpiece 18 is etched as shown by the broken lines in FIG. 3(a). It is to be noted here that the etching rate for the substrate 31 and the resist 32 is far lower than that for the workpiece 18.

(b) After the above etching step (a) has been completed, the relative angle between the ion beam 25 and the workpiece 18 is changed reversely by driving the motor 20 or 23 and the workpiece 18 is again etched as shown by the broken line in FIG. 3(b).

(c) By removing the resist 32, the workpiece 18 is worked to a structure of a trapezoidal cross-sectional shape having gradients as shown in FIG. 3(c).

In the second example, FIGS. 4(a) to 4(d) show the following steps (a) to (d) of the method according to the first embodiment of the present invention.

(a) As shown in FIG. 4(a), a resist 33 is formed on the workpiece 18 which is formed, by sputtering, deposition, etc., on the substrate 31 secured to the support 19. By controlling the motor 20 or 23, the relative angle between the workpiece 18 and the ion beam 25 is set vertically such that the workpiece 18 is etched as shown by the broken lines in FIG. 4(a). Also in this example, etching rate for the substrate 31 and the resist 33 is far lower than that for the workpiece 18.

(b) After the above etching step (a) has been completed, the relative angle between the ion beam 25 and the workpiece 18 is changed by driving the motor 20 or 23 so as to be set obliquely such that the workpiece 18 is again etched through time control as shown by the broken lines in FIG. 4(b).

(c) After the above etching step (b) has been completed, the relative angle between the ion beam 25 and the workpiece 18 is changed reversely such that the workpiece 18 is further etched through time control as shown by the broken lines in FIG. 4(c).

(d) By removing the resist 33, the workpiece 18 is worked to a structure of a special cross-sectional shape which cannot be obtained in ordinary workings.

As described above, in the first and second examples of the steps of the method according to the first embodiment of the present invention, since the workpiece 18 is etched while the relative angle between the ion beam 25 and the workpiece 18 is being changed, a microscopic structure having trapezoidal and other special cross-sectional shapes can be produced.

Figure 3:
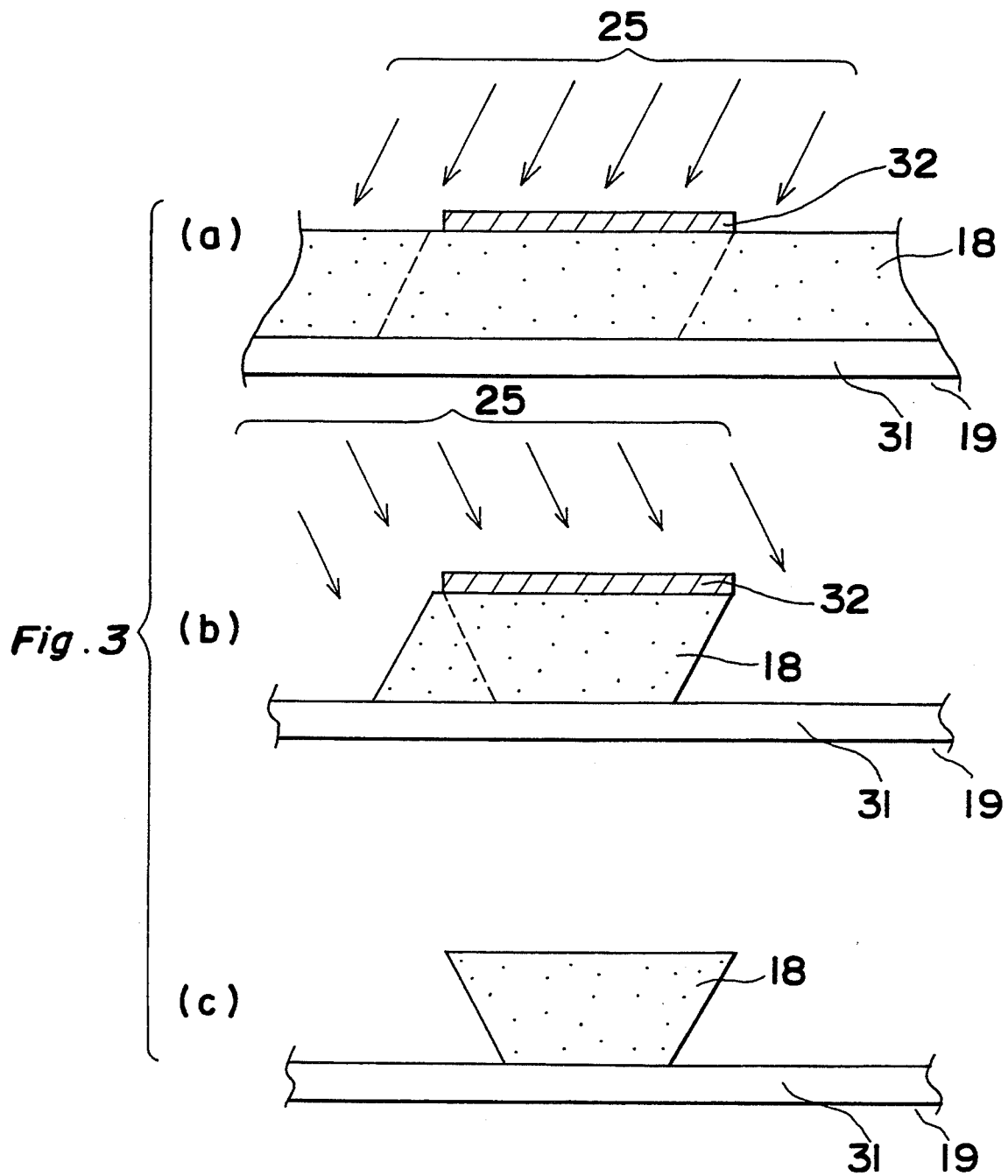
FIGS. 3 to 7 are views showing various examples of steps of the method of FIG. 2, respectively.
Figure 4:
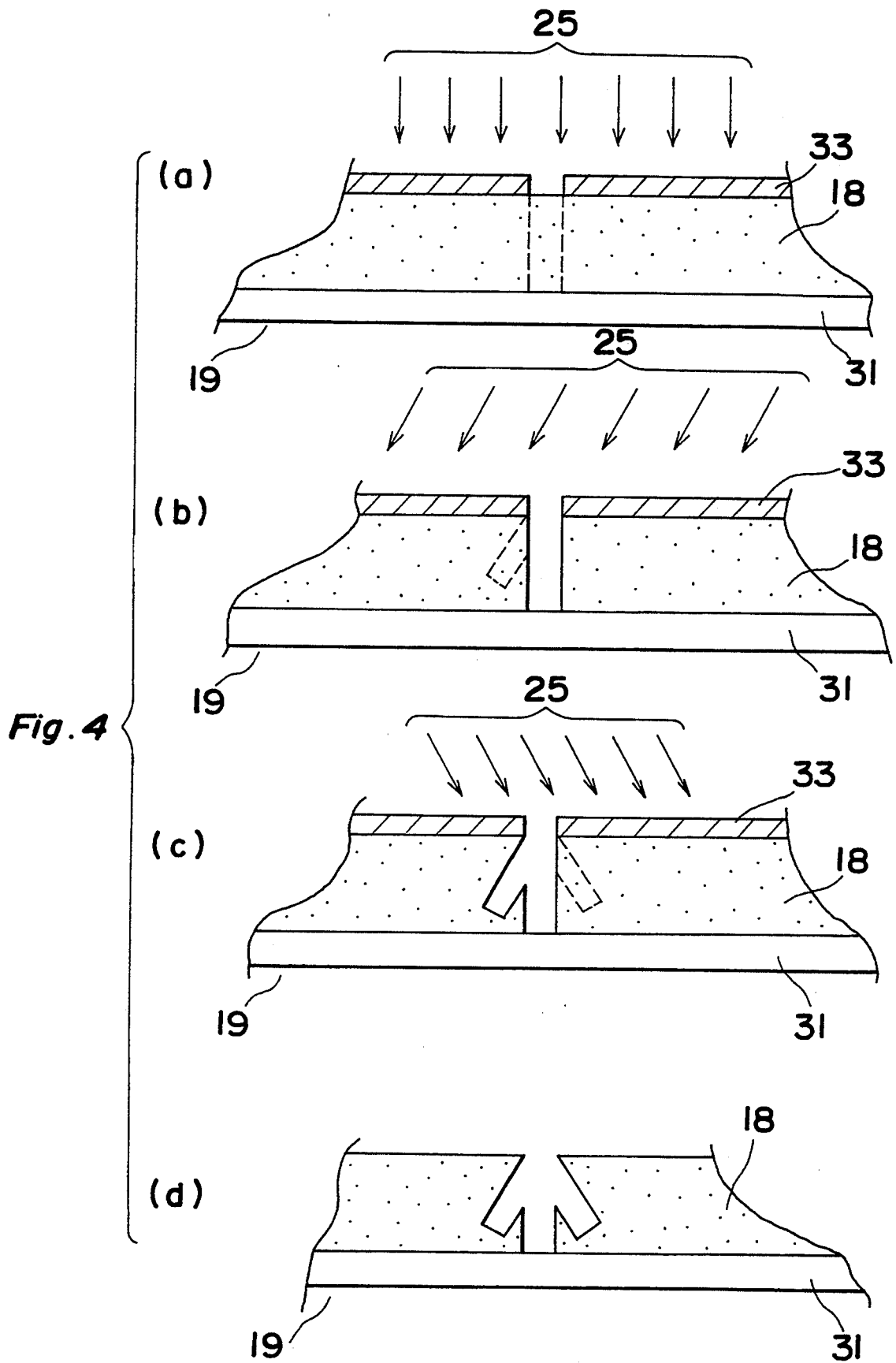

It is needless to say that by properly setting the resist or a relative angle between the resist and the ion beam, a microscopic structure having a shape other than those shown in FIGS. 3 and 4 can be obtained.

In the third example, FIGS. 5(a) to 5(c) show the following steps (a) to (c) of the method according to the first embodiment of the present invention, respectively.

(a) As shown in FIG. 5(a), a resist 34 is formed on the workpiece 18 which is formed, by sputtering, deposition, etc., on the substrate 31 secured to the support 19. In this state, the relative angle between the workpiece 18 and the ion beam 25 is set obliquely such that the workpiece 18 is etched as shown by the broken lines in FIG. 5(a). Also in this example, the etching rate for the substrate 31 and the resist 34 is far lower than that for the workpiece 18.

(b) After the above etching step (a) has been completed, the resist 34 is removed and a resist 35 is formed on the workpiece 18 as shown in FIG. 5(b). The relative angle between the ion beam 25 and the workpiece 18 is changed reversely by driving the motor 20 or 23 such that the workpiece 18 is again etched as shown by the broken line in FIG. 5(b).

(c) By removing the resist 35, the workpiece 18 is worked to a structure of a trapezoidal cross-sectional shape having gradients opposite to those of the structure of the first example of FIGS. 3(a) to 3(c).

In the fourth example, FIGS. 6(a) to 6(d) show the following steps (a) to (d) of the method according to the first embodiment of the present invention, respectively.

(a) As shown in FIG. 6(a), a resist 36 is formed on the workpiece 18 which is formed, by sputtering, deposition, etc., on the substrate 31 secured to the support 19. In this state, the relative angle between the workpiece 18 and the ion beam 25 is set obliquely such that the workpiece 18 is etched as shown by the broken lines in FIG. 6(a). Also in this example, the etching rate for the substrate 31 and the resist 36 is far lower than that for the workpiece 18.

(b) After the above etching step (a) has been completed, the resist 36 is removed and a resist 37 is formed on the workpiece 18. Then, the relative angle between the ion beam 25 and the workpiece 18 is changed reversely by driving the motor 20 or 23 such that the workpiece 18 is again etched as shown by the broken lines in FIG. 6(b).

(c) After the above etching step (c) has been completed, the resist 37 is removed and a resist 38 is formed on the workpiece 18. Subsequently, the relative angle between the ion beam 25 and the workpiece 18 is changed by driving the motor 20 or 23 so as to be set vertically such that the workpiece 18 is again etched as shown by the broken lines in FIG. 6(c).

(d) By removing the resist 38, the workpiece 18 is worked to a structure of a special cross-sectional shape which cannot be obtained in ordinary workings.

As described above, in the third and fourth examples of the steps of the method according to the first embodiment of the present invention, since a plurality of kinds of the resists are employed and the workpiece 18 is etched while the relative angle between the ion beam 25 and the workpiece 18 is being changed, a microscopic structure having trapezoidal and other special cross-sectional shapes can be produced.

Figure 5:
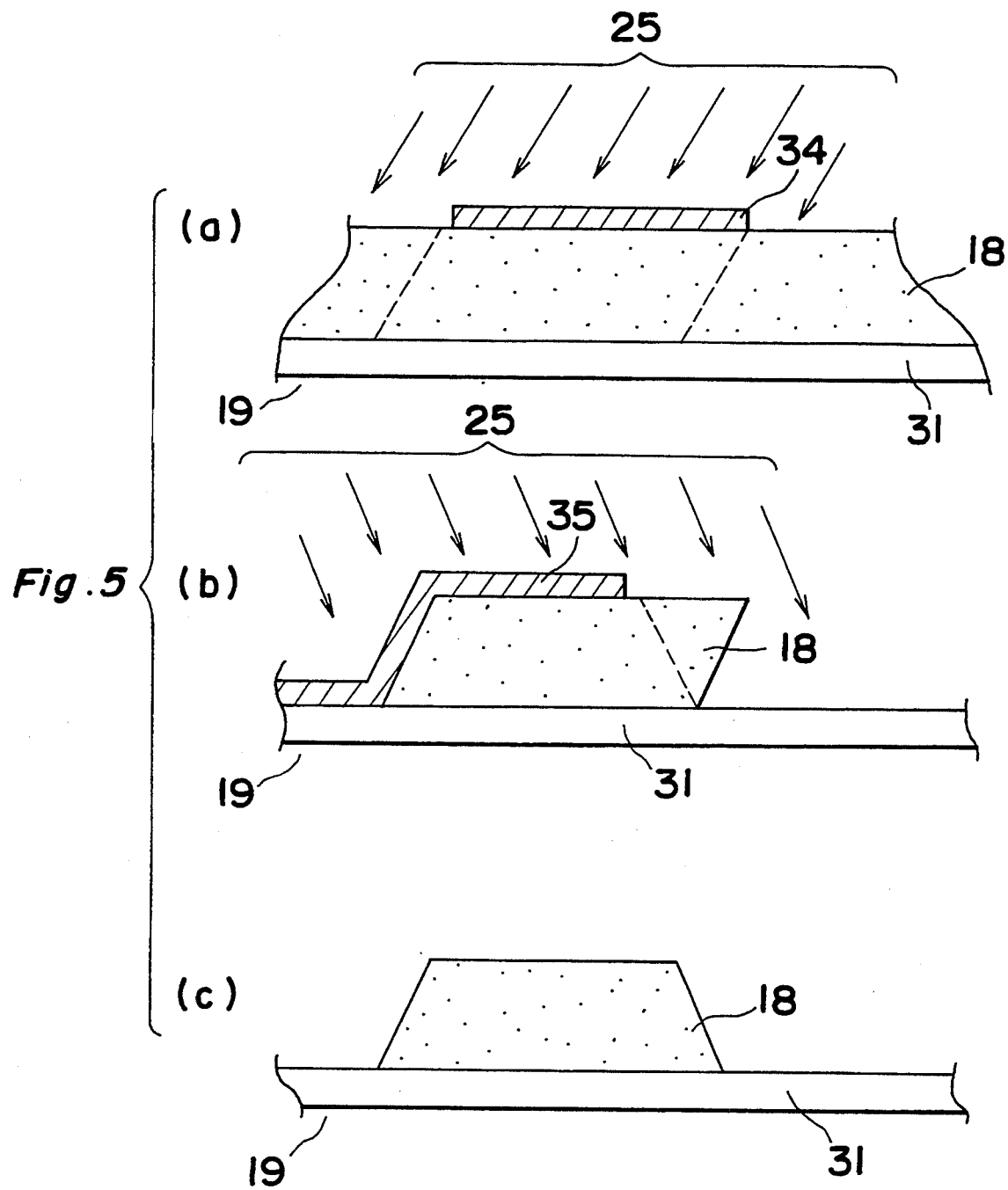
Figure 6:
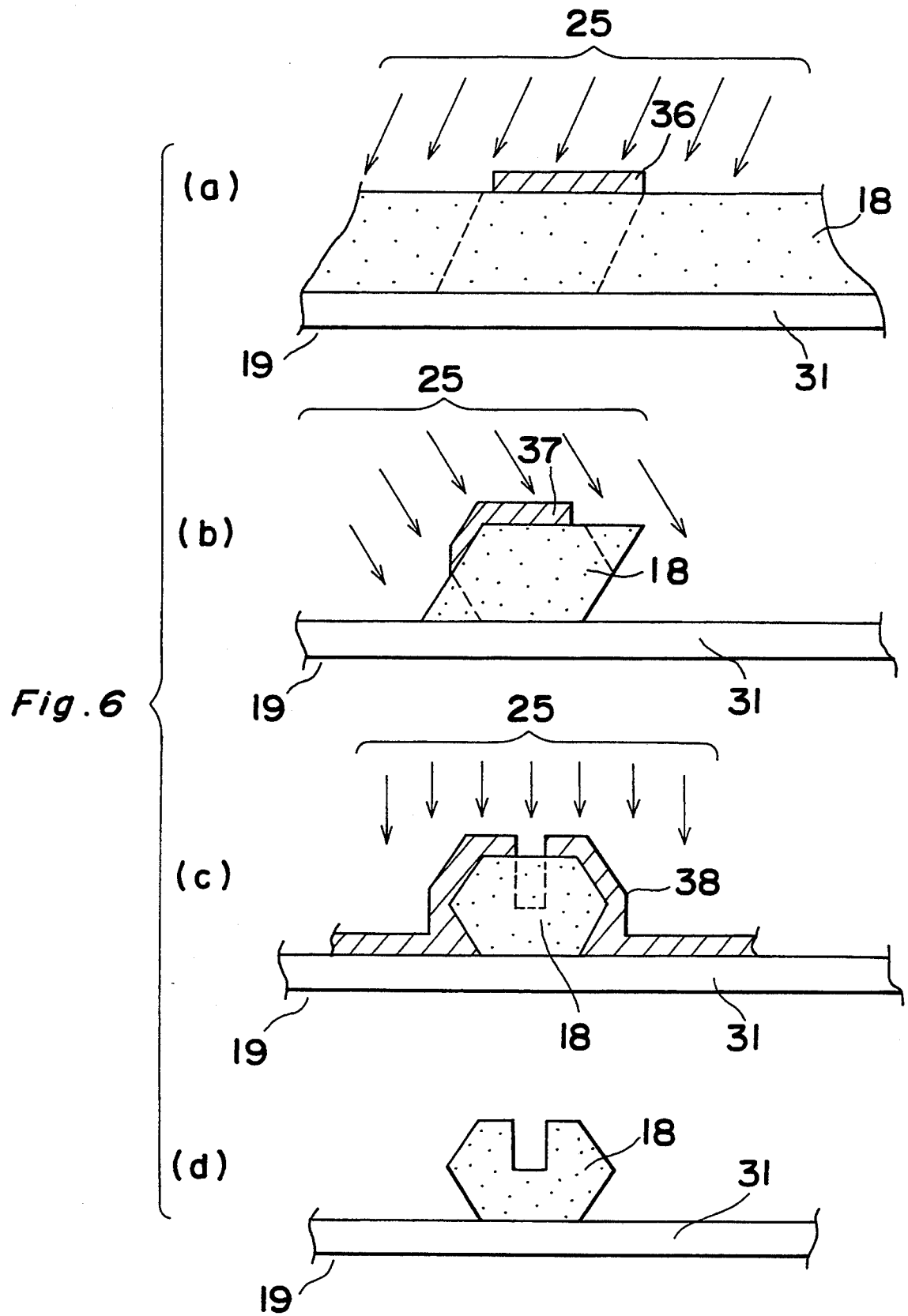
Figure 7:
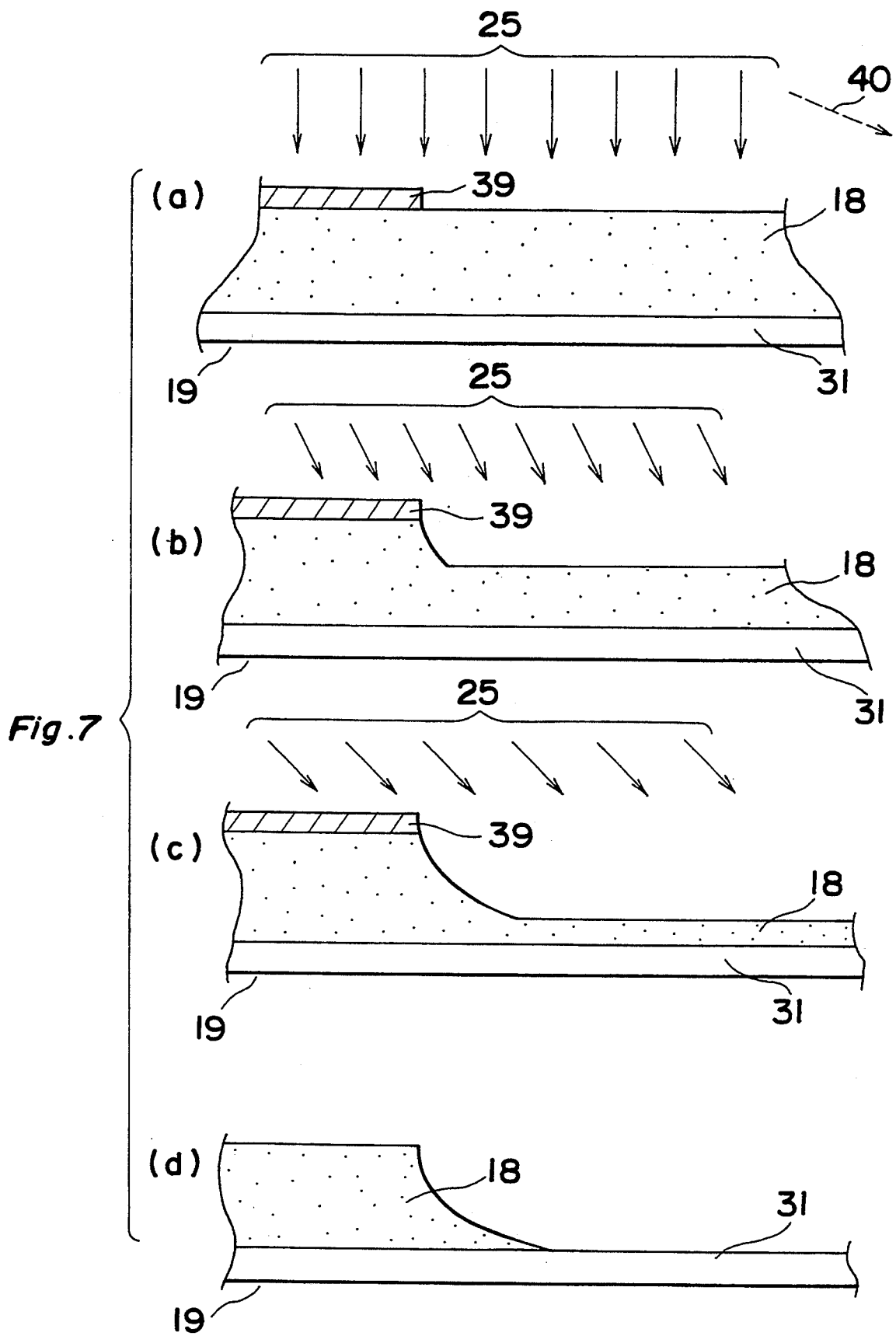

It goes without saying that by properly setting the resist and a relative angle between the resist and the ion beam, a microscopic structure having a shape other than those shown in FIGS. 5 and 6 can be obtained.

In the fifth example, FIGS. 7(a) to 7(d) show the following steps (a) to (d) of the method according to the first embodiment of the present invention, respectively.

(a) As shown in FIG. 7(a), a resist 39 is formed o the workpiece 18 which is formed, by sputtering, deposition, etc., on the substrate 31 secured to the support 19. In this state, the relative angle between the workpiece 18 and the ion beam 25 is initially set vertically as shown in FIG. 7(a). Then, by driving the motor 20 or 23 such that the angle of incidence of the ion beam 25 relative to the workpiece 18 gradually changes in the direction of the arrow 40 in response to progress of etching of the workpiece 18, the workpiece 18 is etched while being rotated. Also in this example, the etching rate for the substrate 31 and the resist 39 is far lower than that for the workpiece 18.

(b) At the time when the relative angle between the workpiece 18 and the ion beam 25 is set as shown in FIG. 7(b) through progress of etching of the workpiece 18, the workpiece 18 has been etched as shown in FIG. 7(b).

(c) At the time when the relative angle between the workpiece 18 and the ion beam 25 is set as shown in FIG. 7(c) through further progress of etching of the workpiece 18, the workpiece 18 has been further etched as shown in FIG. 7(c).

(d) After the above etching step (c) has been completed, the resist 39 is removed and thus, the workpiece 18 is worked to a structure of a curved cross-sectional shape which cannot be obtained in ordinary workings.

As described above, in the fifth example of the steps of the method according to the first embodiment of the present invention, since the workpiece 18 is etched while the relative angle between the ion beam 25 and the workpiece 18 is being gradually changed, a microscopic structure having a curved cross-sectional shape can be produced. Needless to say, by properly setting rotational speed of the workpiece 18, for example, by changing rotational speed of the workpiece 18 continuously or intermittently, a microscopic structure having a shape other than that shown in FIG. 7 can be obtained.

Meanwhile, in the first embodiment of the present invention, material of the workpiece 18 is not restricted to a specific one and thus, such materials as metal, ceramics, silicon, etc. can be properly employed as material of the workpiece 18 in accordance with the relation in etching rate between the workpiece 18 and the resist. Meanwhile, the ion source 14 may be of other types than Kaufmann type.

Furthermore, the first to fifth examples of the first embodiment of the present invention can be combined properly. In this case, it can also be so arranged that the workpiece 18 is etched while being deposited on the substrate 31. Namely, if ion sputtering is employed, it is only necessary to impart sputtering function to the ion etching machine of FIG. 2, which can be performed easily. Moreover, it can also be so arranged that after one workpiece 18 formed on the substrate 31 has been etched, another workpiece 18 is formed on the same substrate 31 so as to be etched.

In the foregoing, etching utilizing the ion beam has been described. However, needless to say, the ion beam is not necessarily required to be used for etching and thus, any procedure enabling anisotropic etching can be employed.

Figure 8:
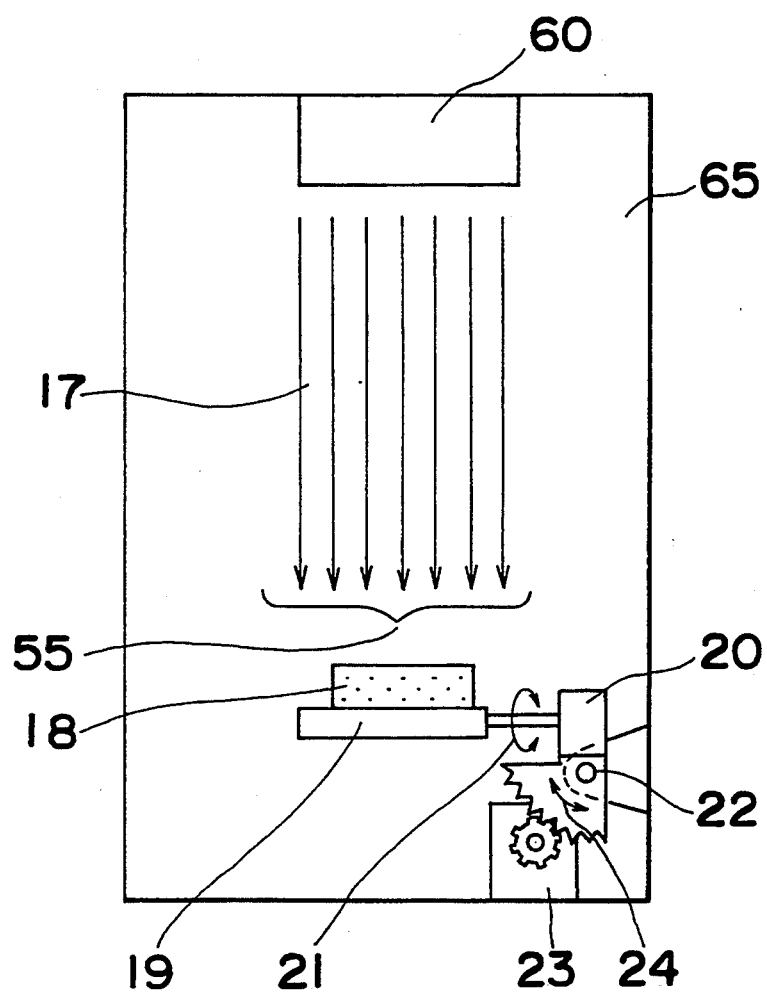
FIG. 8 is a schematic view of a synchrotron radiation machine used for carrying out a method of producing a microscopic structure, according to a second embodiment of the present invention.

Meanwhile, the present invention can be applied to a known method of producing a microscopic structure, for example, a LIGA process. FIG. 8 shows a synchrotron radiation machine used for carrying out a method of producing a microscopic structure, according to a second embodiment of the present invention. The synchrotron radiation machine includes a casing 65 and a synchrotron 60 for emitting synchrotron radiation 55. The synchrotron radiation 55 is a powerful X-ray whose beam has a narrow spread. Since other constructions of the synchrotron radiation machine are similar to those of the ion etching machine of FIG. 2, description thereof is abbreviated.

FIGS. 9(a) to 9(e) show the following steps (a) to (e) of the method of producing the microscopic structure by using the synchrotron radiation machine of FIG. 8, according to the second embodiment of the present invention, respectively. In FIGS. 9(a) to 9(e), reference numeral 51 denotes a metallic substrate 51, reference numeral 52 denotes a PMMA resist film 52 coated thickly on the metallic substrate 51, reference numeral 53 denotes a masking substrate, reference numeral 54 denotes a masking pattern and reference numeral 56 denotes electroformed nickel.

Figure 9:
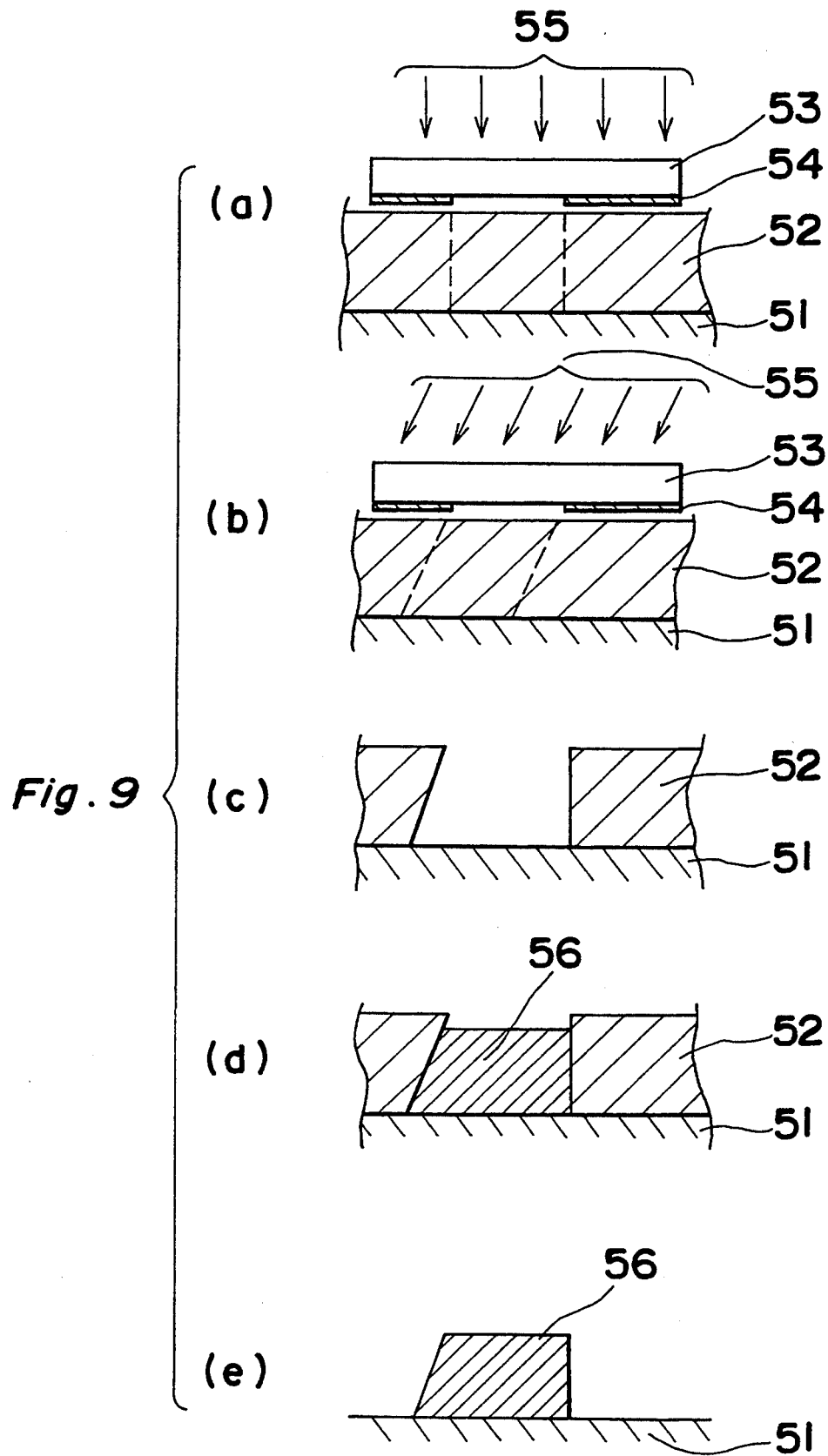
FIGS. 9(a) to 9(e) are views showing steps of the method of FIG. 8.

(a) The PMMA resist film 52 is vertically exposed through the masking pattern 54 as shown by the broken lines in FIG. 9(a) by using the synchrotron radiation 55 emitted by the synchrotron 60.

(b) A relative angle between the synchrotron radiation 55 and the PMMA resist film 52 is changed so as to be set obliquely such that the PMMA resist film 52 is again exposed through the masking pattern 54 as shown by the broken lines in FIG. 9(b).

(c) The exposed portion of the PMMA resist film 52 is removed by development such that a cavity is formed in the PMMA resist film 52 as shown in FIG. 9(c).

(d) The nickel 56 is filled in the cavity of the PMMA resist film 52 by electroforming as shown in FIG. 9(d).

(e) The PMMA resist film 52 is removed. As a result, the electroformed nickel 56 remains on the metallic substrate 51 so as to have a cross-sectional shape of gradients which cannot be obtained in the conventional LIGA process.

As described above, in the second embodiment of the present invention, since the PMMA resist film 52 is exposed while the relative angle between the synchrotron radiation 55 and the PMMA resist film 52 is being changed, a microscopic structure having a cross-sectional shape of gradients which cannot be obtained in the known processes can be produced. Needless to say, by properly setting the resist or the relative angle, a microscopic structure having a shape other than that shown in FIG. 9(e) can be obtained. Furthermore, it is possible to combine the first and second embodiments of the present invention. Moreover, it goes without saying that the procedure for exposure is not restricted to the one referred to above. Meanwhile, in this embodiment, the light source is not restricted to the synchrotron. Thus, even if a wavelength is not so short as that of the synchrotron radiation, a laser for emitting a laser beam having a short wavelength and directivity, for example, an excimer laser can be likewise used for producing the microscopic structure.

As is clear from the foregoing description, in accordance with the present invention, it becomes possible to obtain a three-dimensional structure of a high degree of freedom, in which its cross-sectional shape has gradients or its shape has a combination of straight lines and curves.

Although the present invention has been described by way of example with reference to the accompanying drawings, it is to be noted here that various changes and modifications will be apparent to those skilled in the art. Therefore, unless otherwise such changes and modifications depart from the scope of the present invention, they should be construed as being included therein.

What is claimed is:

1. A method of producing a microscopic structure by ion etching, in which an ion beam emitted by an ion source is irradiated over a workpiece by using a plurality of kinds of resists,
wherein an angle of incidence of the ion beam relative to the workpiece is changeable,
etching of an identical layer of the workpiece being repeated while changing the angle of incidence of the ion beam relative to the workpiece each time replacement of the resists is performed, whereby the workpiece has an irregular desired cross-sectional shape.

2. A method as claimed in claim 1, wherein the workpiece is formed on a substrate, and after the workpiece formed on substrate has been etched, a further workpiece is formed on the substrate so as to be etched.

* * * * *